United States Patent [19]

Terashima et al.

[11] Patent Number: 5,231,300
[45] Date of Patent: Jul. 27, 1993

[54] SEMICONDUCTOR INTEGRATED CIRCUIT HAVING A DIGITAL CIRCUIT

[75] Inventors: Kaoru Terashima; Kazuo Ishikawa, both of Kawasaki, Japan

[73] Assignee: Kabushiki Kaisha Toshiba, Kawasaki, Japan

[21] Appl. No.: 716,783

[22] Filed: Jun. 18, 1991

[30] Foreign Application Priority Data

Jun. 21, 1990 [JP] Japan .................................. 2-161416

[51] Int. Cl.⁵ ............................................ H01L 27/02
[52] U.S. Cl. ..................... 257/370; 257/378; 257/691
[58] Field of Search .................. 357/42, 43; 257/370, 257/371, 372, 369, 378, 691

[56] References Cited

U.S. PATENT DOCUMENTS

| | | | |
|---|---|---|---|
| 4,442,529 | 4/1984 | Ahuja et al. | 357/42 |
| 4,727,518 | 2/1988 | Madland | 357/51 |
| 5,014,105 | 5/1991 | Hata et al. | 357/42 |
| 5,060,044 | 10/1991 | Tomassetti | 357/43 |
| 5,079,613 | 1/1992 | Sawada et al. | 357/42 |
| 5,099,239 | 3/1992 | Bruce et al. | 341/128 |

FOREIGN PATENT DOCUMENTS

| | | |
|---|---|---|
| 0033154 | 8/1981 | European Pat. Off. . |
| 0255125 | 2/1988 | European Pat. Off. . |
| 59-22357 | 2/1984 | Japan .................................. 257/369 |
| 59-43563 | 3/1984 | Japan . |

OTHER PUBLICATIONS

V. L. Rideout an dL. Wissel, "Selective Substrate Biasing for CMOS Circuits", IBM Technical Disclosure Bulletin, vol. 27, No. 6, p. 3344, Nov. 1984.

Primary Examiner—Andrew J. James
Assistant Examiner—Courtney A. Bowers
Attorney, Agent, or Firm—Finnegan, Henderson, Farabow, Garrett & Dunner

[57] ABSTRACT

In a semiconductor integrated circuit, a digital circuit section and an analog circuit section are formed on a substrate. A pair of first power source lines connects a circuit element in the digital circuit section to a power source, while a pair of second power source lines connects a substrate region in the digital circuit section to the power source. The pair of second power source lines is formed separately from the pair of first power source lines in the digital circuit section. The substrate region in the digital circuit section is surrounded by a guard ring well, to which one of the pair of second power source lines is connected.

7 Claims, 3 Drawing Sheets

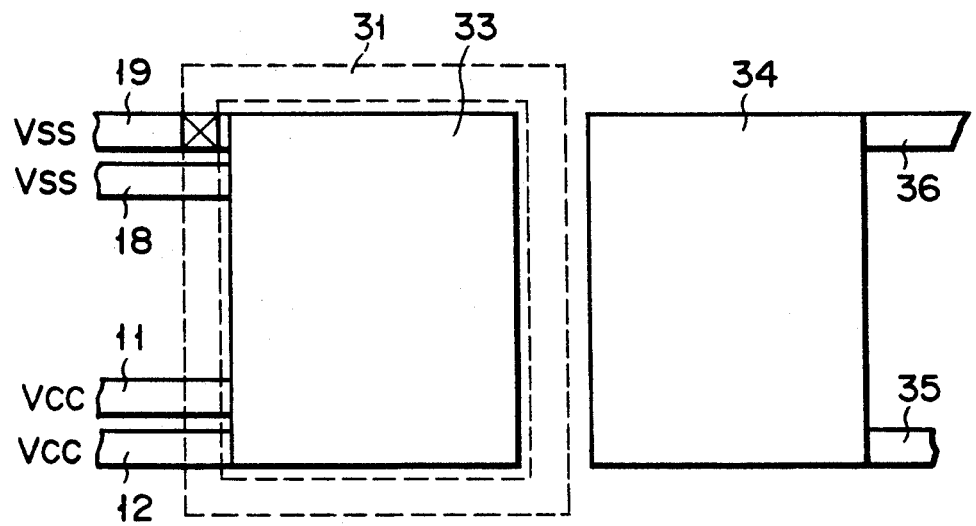
F I G. 3
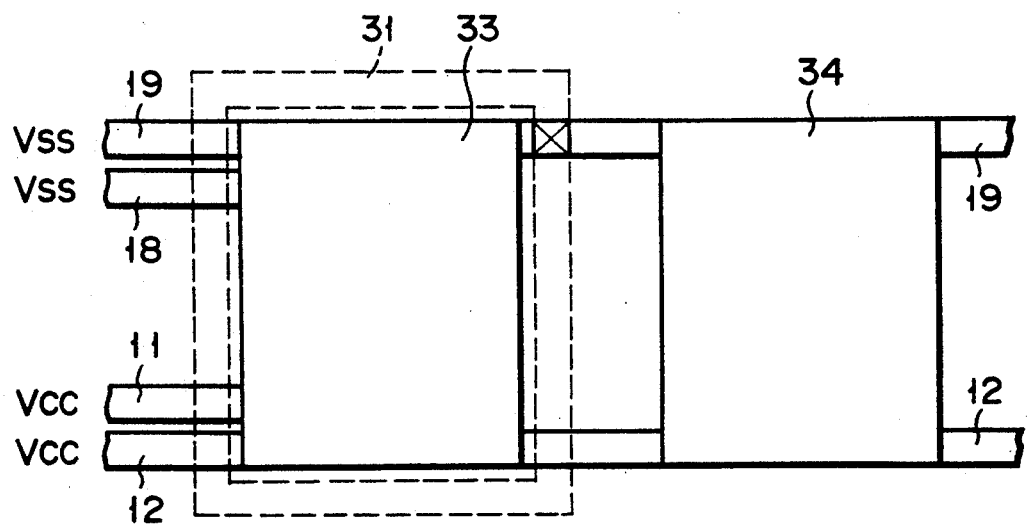
F I G. 4

SEMICONDUCTOR INTEGRATED CIRCUIT HAVING A DIGITAL CIRCUIT

BACKGROUND OF THE INVENTION

1. Field of the Invention

This invention relates to a semiconductor circuit, and more particularly to a power-source wiring of a digital circuit section in a semiconductor integrated circuit that contains the digital circuit section as a first circuit section, and a second circuit section, such as an analog circuit section.

2. Description of the Related Art

FIG. 5 shows a conventional pattern of power source lines for a digital circuit section 40 in a large-scale integrated circuit containing analog circuit sections and digital circuit sections.

Here, numeral 41 indicates a $V_{cc}$ line; 42 a contact portion of the $V_{cc}$ line with an n+ region 43 in an n-type semiconductor substrate; 44 a p-channel MOS transistor region formed in the n-type semiconductor substrate; 45 a p-well formed in the n-type semiconductor substrate; 46 an n-channel MOS transistor region formed in the p-well, 47 a $V_{ss}$ line (the ground potential); and 48 a contact portion of the $V_{ss}$ line with a p+ region 49 in the p-well 45.

That is, in the digital circuit section 40, the power source lines 41 and 47 are formed so as to connect to both a circuit element and the substrate (the n-type semiconductor substrate or p-well 45).

In LSI circuits containing both analog and digital circuit sections, electric noise (e.g., noise due to high-speed switching) generated at the digital circuit section 40 often travels along the power source lines 41 and 47, and reaches the substrate via the contact portions 42 and 48 of the lines 41 and 47 with the substrate. It then spreads over the substrate and is absorbed by an analog circuit section (not shown). Such absorption gives an adverse effect on the analog circuit section.

As described above, in conventional semiconductor integrated circuits containing both analog circuit sections and digital circuit sections, the leakage of noises occurring at a digital circuit section into the substrate via the digital circuit power source lines often adversely affects the analog circuit sections.

SUMMARY OF THE INVENTION

It is, accordingly, an object of the present invention to overcome the above problems by providing a semiconductor integrated circuit that prevents noises generated at a digital circuit section from leaking from the power source lines to the substrate, so that such noises do not adversely affect other circuit sections, such as analog circuit sections, thereby ensuring their stable characteristics.

The foregoing object is accomplished by a semiconductor integrated circuit that has a first circuit section, which is a digital circuit section, and a second circuit section formed on a substrate, comprising a pair of first power source lines for connecting a circuit element in the digital circuit section to power source means, and a pair of second power source lines for connecting a substrate region in the digital circuit section to power source means, the pair of second power source lines being formed separately from the pair of first power source lines in said digital circuit section.

The second circuit section comprises, for example, an analog circuit section or a digital circuit section. It is preferable to connect the pair of first power source lines and the pair of second power source lines to separate power source pads, respectively. The digital circuit section may share the pair of second power source lines with the other circuit sections.

In an embodiment, the substrate region in the digital circuit section is surrounded by a guard ring well, to which one of the pair of second power source lines is connected.

With this invention, even if noises occurring at the digital circuit section travel along the first power source lines, the separate formation of the second power source lines from the first power source lines at least in the digital circuit section prevents such noises from leaking into the substrate via the contact portion of the second power source lines with the substrate. As a result of this, the other circuit sections are not adversely affected, providing the stable characteristic of the other circuit sections.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is an explanatory diagram for a layout of a semiconductor integrated circuit according to a second embodiment of the present invention;

FIG. 4 is an explanatory diagram for a layout of a semiconductor integrated circuit according to a third embodiment of the present invention.

DETAILED DESCRIPTION OF THE PREFERRED EMBODIMENTS

Figure 1:
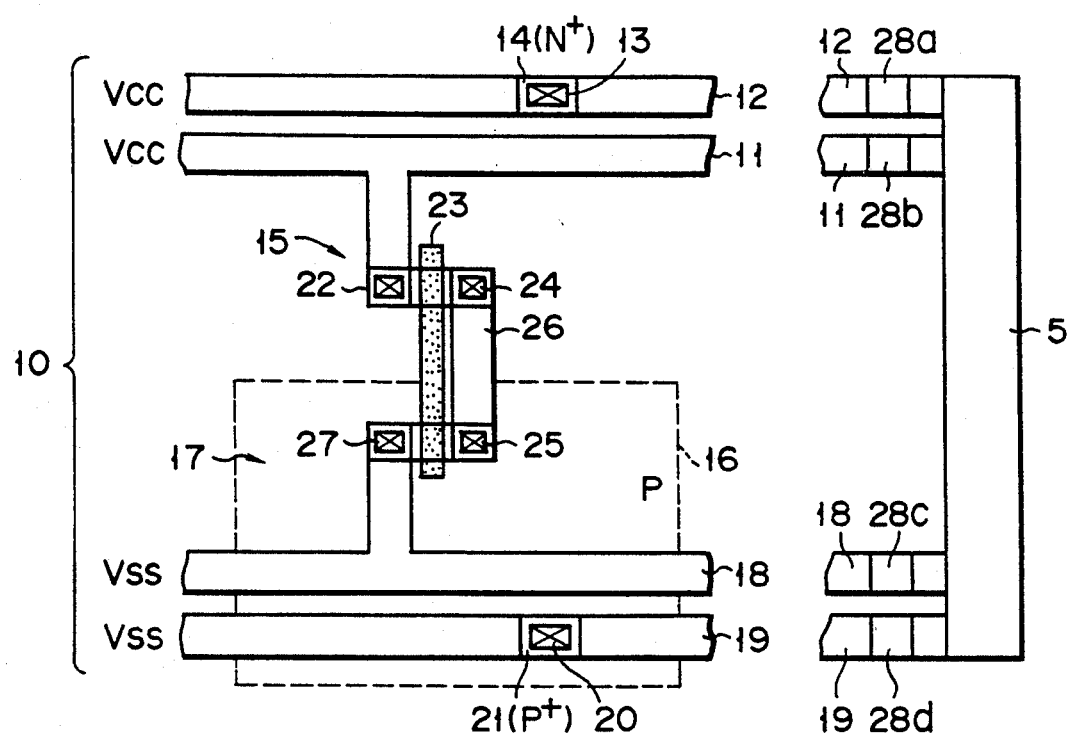
FIG. 1 is an explanatory diagram for a power source line layout of a digital circuit section in a semiconductor integrated circuit according to the present invention.

FIG. 1 shows a wiring pattern from the power source 5 to a digital circuit section 10 in an LSI where the digital circuit section 10 is packed together with another circuit section, such as an analog circuit section. Here, a CMOS inverter is used as the digital circuit section 10, for example.

In the figure, numeral 11 indicates a first $V_{cc}$ line connected to a circuit element in the digital circuit section 10; 12 a second $V_{cc}$ line connected to a substrate (an n-type semiconductor substrate) in the digital circuit section 10; and 13 a contact portion of the second $V_{cc}$ line with an n+ region 14 in the n-type semiconductor substrate.

Numeral 15 represents a p-channel MOS transistor region formed in the n-type semiconductor substrate; 16 a p-well formed in the n-type semiconductor substrate; and 17 an n-channel MOS transistor region formed in the p-well 16.

Numeral 18 indicates a first $V_{ss}$ line (the ground potential) connected to the circuit element in the digital circuit section 10; 19 a second $V_{ss}$ line (the ground potential) connected to the substrate (the p-well 16) in the digital circuit section 10, and 20 the contact portion of the second $V_{ss}$ line 19 with a p+ region 21 in the p-well 16.

Numeral 22 represents a source contact portion of the p-channel transistor; 23 a gate electrode of the MOS transistor; 24 a drain contact portion of the p-channel transistor; 25 a drain contact portion of the n-channel transistor; 26 a drain wiring between the p-channel transistor and n-channel transistor; and 27 a source contact portion of the n-channel transistor.

At least in the digital circuit section, the first power source lines 11 and 18 connected to the circuit element in the digital circuit section 10 is formed separately from the second power source lines 12 and 19 connected to the substrate (the n-type semiconductor substrate or p-well 16) in the same section 10. Outside the digital circuit section, the first lines 11 and 18 and the second lines 12 and 19 are preferably kept separated from each other on the semiconductor chip and connected to power source pads $28_a$ through $28_d$, respectively. In this region, they may be formed integrally so as to meet each other near the power source pads (not shown) on the semiconductor chip.

With the LSI of FIG. 1, even if noises occurring at the digital circuit section 10 travel along the first lines 11 and 18 in the same section 10, the separate formation of the first lines 11 and 18 from the second lines 12 and 19 at least in the digital circuit section prevents the noises from leaking into the substrate via the contact portions 13 and 20 of the second lines 12 and 19 with the substrate. Thus, other circuit sections, such as analog circuit sections, (not shown) are not adversely affected, leading to the stable characteristics of the other circuit sections.

Figure 2:
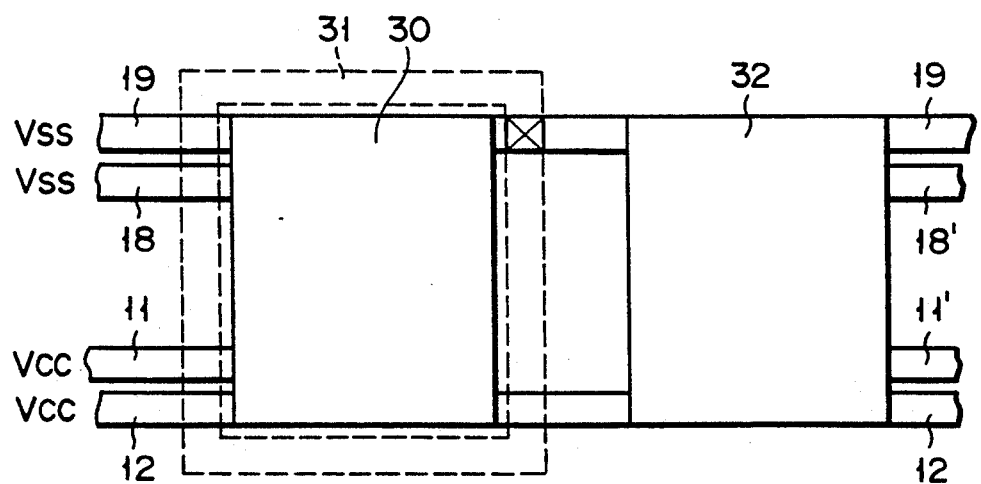
FIG. 2 is an explanatory diagram for a layout of a semiconductor integrated circuit according to a first embodiment of the present invention.
Figure 5:
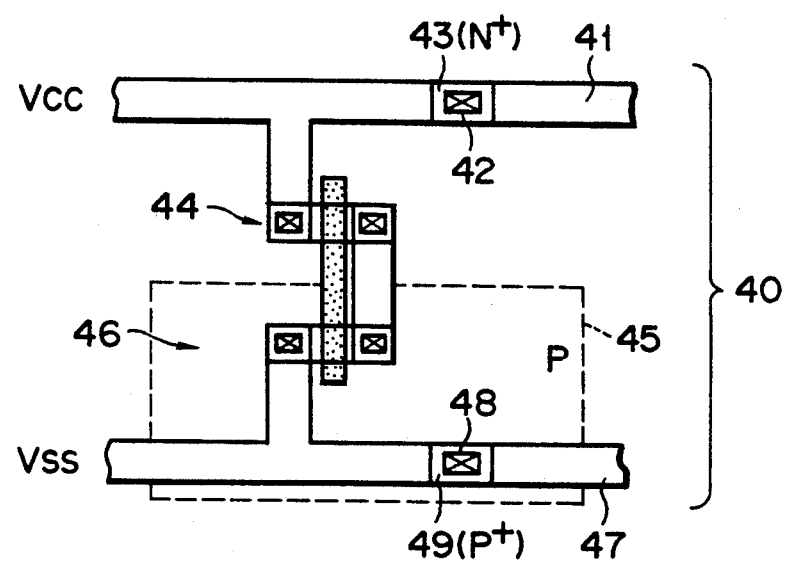
FIG. 5 is an explanatory diagram for a layout of a conventional semiconductor integrated circuit.

FIG. 2 illustrates the layout of a semiconductor integrated circuit according to a first embodiment of the present invention. This circuit contains a plurality of digital circuit sections 30 and 32. The same parts in FIG. 2 and FIG. 1 are indicated by the same reference characters.

In this embodiment, a first digital circuit section 30 (particularly, a digital circuit section that tends to generate large amounts of noise, such as a high-power output buffer or a high-frequency digital circuit section) and the other digital circuit section 32 each have the construction as shown in FIG. 1. That is, the first digital circuit section 30 contains the first power source lines 11 and 18 and the second power source lines 12 and 19, while the other digital circuit section 32 contains the first power source lines 11' and 18' and the second power source lines 12 and 19 that are shared by the first digital circuit section 30.

The substrate region (e.g., the n-type semiconductor substrate) in the first digital circuit section 30 is surrounded by a guard ring well (e.g., a p-well) 31. To this guard ring well 31, one of the second lines 12 and 19 is connected. (In this embodiment, the second $V_{ss}$ line 19 is connected.)

With the LSI circuit of FIG. 2, which assures the similar results to those described in FIG. 1, use of the guard ring 31 prevents noises from leaking from the digital circuit section 30 that causes a large amount of noise to other circuit sections, such as the other digital circuit section 32 and, in some cases, an analog circuit section (not shown) on the same substrate.

FIG. 3 shows the layout for a semiconductor integrated circuit according to a second embodiment of the present invention. This circuit contains a digital circuit section 33 and an analog circuit section 34. The same parts in FIGS. 3, 2, and 1 are indicated by the same reference characters.

In this embodiment, the digital circuit section 33 contains the first power source lines 11 and 18 and the second power source lines 12 and 19, while the analog circuit section 34 contains a $V_{cc}$ line 35 and a $V_{ss}$ line 36.

The entire substrate (e.g., the n-type semiconductor substrate) region in the digital circuit section 33 is surrounded by a guard ring well (e.g., a p-well) 31, to which one of the second lines 12 and 19 is connected. (In this embodiment, the second $V_{ss}$ line 19 is connected.)

With the LSI circuit of FIG. 3, which ensures the similar results as in FIG. 1, use of the guard ring 31 prevents noises from leaking from the digital circuit section 33 that causes especially large amounts of noise to the analog circuit 34.

FIG. 4 shows the layout for a semiconductor integrated circuit according to a third embodiment of the present invention. This circuit includes the digital circuit section 33 and the analog circuit section 34. The same parts in FIGS. 4, 3, 2, and 1 are indicated by the same reference characters.

In this embodiment, the second power lines 12 and 19 are shared by the digital circuit section 33 and the analog circuit section 34.

While in each embodiment described above, an LSI circuit whose p-well is formed in the n-type semiconductor substrate is used, an LSI circuit whose n well is formed in the p-type semiconductor substrate may be used to provide the similar results as described above.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor integrated circuit comprising:
   a substrate;
   a first circuit section including a circuit element formed on a region of said substrate, said first circuit section being a digital circuit section;
   a second circuit section spaced form the first circuit section formed on said substrate, said second circuit section including an analog circuit section;
   power source means;
   a pair of first power source lines connecting said circuit element of said first circuit section to said power source means; and
   a pair of second power source lines disposed spaced from the pair of first power source lines connecting said substrate region of said first circuit section and said second circuit section to said power source means, said first circuit section sharing said pair of second power source lines with said second circuit section.

2. A semiconductor integrated circuit comprising:

a substrate;

a digital circuit section including a circuit element formed on a region of said substrate;

an analog circuit section spaced from the digital circuit section formed on said substrate;

power source means;

a pair of first power source lines connecting said circuit element in said digital circuit section to said power source;

a pair of second power source lines disposed spaced from the pair of first power source lines connecting said analog circuit section and said substrate region of said digital circuit section to said power source means; and a guard ring well disposed to surround said substrate region in said digital circuit sections, said guard ring well being connected to one of said pair of second power source lines.

3. A semiconductor integrated circuit according to claim 1, wherein said second circuit section comprises a digital circuit section.

4. A semiconductor integrated circuit according to claim 1, wherein said pair of first power source lines and said pair of second power source lines are connected to separate power source pads, respectively.

5. A semiconductor integrated circuit according to claim 1, wherein the substrate region in said first circuit section is surrounded by a guard ring well, to which one of said pair of second power source lines is connected.

6. A semiconductor integrated circuit according to claim 3, wherein the substrate region in said first circuit section is surrounded by a guard ring well, to which one of said pair of second power source lines is connected.

7. A semiconductor integrated circuit according to claim 2, wherein said pair of first power source lines and said pair of second power source lines are connected to separate power source pads.

* * * * *